(12) United States Patent
Corbin

(10) Patent No.: US 10,088,528 B2
(45) Date of Patent: Oct. 2, 2018

(54) BATTERY LIFE TRACKING FOR WIRELESS SENSOR SYSTEMS

(71) Applicant: Sikorsky Aircraft Corporation, Stratford, CT (US)

(72) Inventor: Scott Alan Corbin, Port Matilda, PA (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 718 days.

(21) Appl. No.: 14/101,582

(22) Filed: Dec. 10, 2013

(65) Prior Publication Data

US 2015/0160303 A1 Jun. 11, 2015

(51) Int. Cl.
*G01R 31/36* (2006.01)

(52) U.S. Cl.
CPC .......... *G01R 31/3606* (2013.01); *G01R 31/36* (2013.01); *G01R 31/3648* (2013.01); *G01R 31/3679* (2013.01); *G01R 31/3689* (2013.01)

(58) Field of Classification Search
CPC ..................... G01R 31/3606; G01R 31/3648
USPC .................................................. 702/63
See application file for complete search history.

(56) References Cited

U.S. PATENT DOCUMENTS

| | | | |
|---|---|---|---|
| 5,455,499 A * | 10/1995 | Uskali | H02J 7/0004 320/DIG. 21 |
| 7,061,246 B2 | 6/2006 | Dougherty et al. | |
| 7,593,822 B2 | 9/2009 | Stewart | |
| 7,643,951 B2 | 1/2010 | Stewart | |
| 7,960,945 B1 * | 6/2011 | Onorato | G01R 31/3606 320/132 |
| 8,285,340 B2 * | 10/2012 | Hackborn | G06F 11/3409 348/189 |
| 8,509,923 B2 | 8/2013 | Koskan et al. | |
| 9,015,513 B2 * | 4/2015 | Murawski | H04W 52/0261 713/300 |
| 2006/0217914 A1 * | 9/2006 | Bertness | B60C 23/0408 702/113 |
| 2008/0136654 A1 * | 6/2008 | Toriello | G01R 31/3679 340/636.1 |
| 2009/0047994 A1 * | 2/2009 | Sommer | H04M 1/7253 455/556.1 |
| 2009/0066529 A1 * | 3/2009 | Fukada | G01R 31/3689 340/657 |
| 2011/0072292 A1 * | 3/2011 | Khawand | G06F 1/3203 713/340 |
| 2012/0130660 A1 * | 5/2012 | Neumeyer | G01R 31/3679 702/63 |
| 2013/0066153 A1 * | 3/2013 | McGrath | A61B 1/00034 600/188 |
| 2013/0072757 A1 * | 3/2013 | Mcgrath | A61B 1/00034 600/188 |

(Continued)

*Primary Examiner* — Paul D Lee
(74) *Attorney, Agent, or Firm* — Cantor Colburn LLP

(57) ABSTRACT

Embodiments are directed to predicting an amount of energy associated with a battery, by: storing, by a node, a value for an amount of energy drawn from the battery for each type of operation performed by the node, storing, by the node, a value for an amount of energy drawn from the battery when the node is active based on the stored amount of energy drawn for each type of operation, and transmitting, by the node, an indication of the amount of energy drawn from the battery in order to compute a prediction of the remaining battery energy.

22 Claims, 2 Drawing Sheets

(56) References Cited

U.S. PATENT DOCUMENTS

2013/0311016 A1* 11/2013 Kim .................. B60L 11/1862
                                                        701/22

* cited by examiner

BATTERY LIFE TRACKING FOR WIRELESS SENSOR SYSTEMS

BACKGROUND

Nodes, such as wireless sensor nodes, are often battery operated. In some applications, a battery may be required to power a node for a long time (e.g., years). Moreover, the node may be located in a place where access is limited, making battery replacement difficult and expensive.

Nodes are often powered by batteries that are based on lithium technology. Such batteries have a very flat voltage discharge curve, making accurate sensing of the battery's remaining energy difficult. Coulomb counters can be used to directly track energy drain from the battery. However, coulomb counters consume too much energy and are impractical in applications where limited battery capacity is available and where long service life is needed.

BRIEF SUMMARY

An embodiment is directed to a method for predicting an amount of energy associated with a battery, comprising: storing, by a node, a value for an amount of energy drawn from the battery for each type of operation performed by the node, storing, by the node, a value for an amount of energy drawn from the battery when the node is active based on the stored amount of energy drawn for each type of operation, and transmitting, by the node, an indication of the amount of energy drawn from the battery in order to compute a prediction of the remaining battery energy.

An embodiment is directed to an apparatus for predicting an amount of energy associated with a battery comprising: at least one processor, and memory having instructions stored thereon that, when executed by the at least one processor, cause the apparatus to: store a value for an amount of energy drawn from a battery powering the apparatus for each type of operation performed by the apparatus, store a value for an amount of energy drawn from the battery when the apparatus is active based on the stored amount of energy drawn for each type of operation, and transmit an indication of the amount of energy drawn from the battery in order to compute a prediction of the remaining battery energy.

An embodiment is directed to an aircraft comprising: a wireless node configured to: store a value for an amount of energy drawn from a battery powering the node for each type of operation performed by the node, store a value for an amount of energy drawn from the battery when the node is active based on the stored amount of energy drawn for each type of operation, and transmit an indication of the amount of energy drawn from the battery in order to compute a prediction of the remaining battery energy.

An embodiment is directed to an apparatus comprising: at least one processor, and memory having instructions stored thereon that, when executed by the at least one processor, cause the apparatus to: store first values corresponding to energy consumed by a wireless node for a plurality of operation types, store a second value corresponding to an initial battery energy associated with a battery that powers the wireless node, and predict a remaining battery energy associated with the battery based on the first values and the second value.

Additional embodiments are described below.

BRIEF DESCRIPTION OF THE DRAWINGS

The present disclosure is illustrated by way of example and not limited in the accompanying figures in which like reference numerals indicate similar elements.

DETAILED DESCRIPTION

Figure 1:
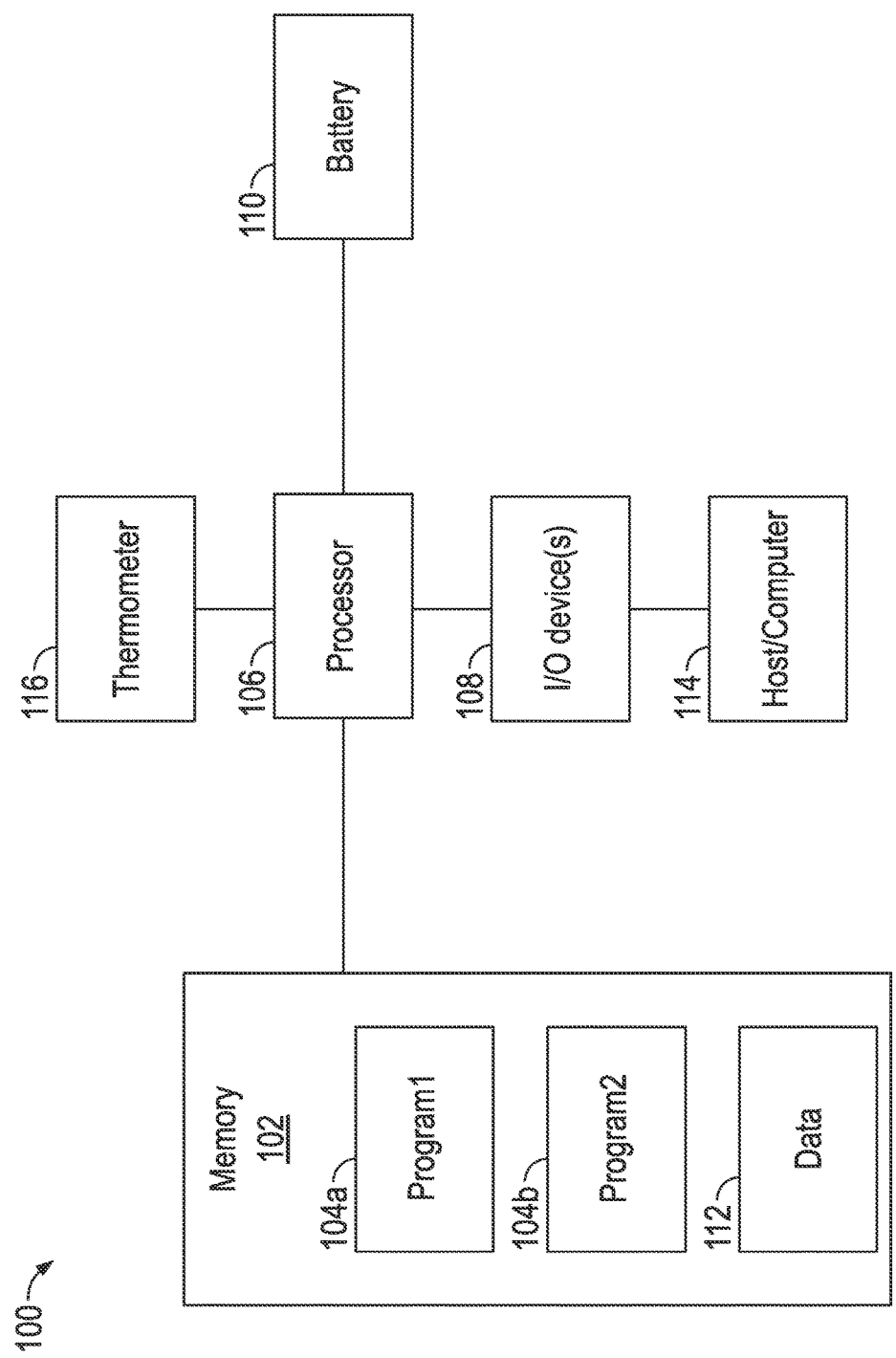
FIG. 1 is a schematic block diagram illustrating an exemplary computing system.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this respect, a coupling between entities may refer to either a direct or an indirect connection.

Exemplary embodiments of apparatuses, systems, and methods are described for determining or estimating remaining battery life. Embodiments may provide an indication regarding when battery replacement should be scheduled to minimize the frequency and cost of maintenance while still ensuring node operation. In some embodiments, a profile of usage and energy consumption as a function of operations performed by the node may be used to adjust the operation of the node; in this manner, battery life may be maximized or extended.

Referring to FIG. 1, an exemplary system 100 is shown. At least a portion of the system 100 may be included in a node, such as a wireless sensor node.

The system 100 is shown as including a memory 102. The memory 102 may store executable instructions. The executable instructions may be stored or organized in any manner and at any level of abstraction, such as in connection with one or more applications, processes, routines, procedures, methods, etc. As an example, at least a portion of the instructions are shown in FIG. 1 as being associated with a first program 104a and a second program 104b.

The instructions stored in the memory 102 may be executed by one or more processors, such as a processor 106. The processor 106 may be coupled to one or more input/output (I/O) devices 108. In some embodiments, the I/O device(s) 108 may include one or more of a keyboard or keypad, a touchscreen or touch panel, a display screen, a microphone, a speaker, a mouse, a button, a remote control, a control stick, a joystick, a printer, a telephone or mobile device (e.g., a smartphone), etc. The I/O device(s) 108 may be configured to provide an interface to allow a user to interact with the system 100. The I/O device(s) 108 may include one or more transmitters or receivers for communicating data with another device or entity.

The processor 106 may be coupled to one or more batteries, such as a battery 110. The battery 110 may provide power to the system 100. The battery 110 may be based on one or more technologies, such as lithium technology.

The memory 102 may store data 112. The data 112 may pertain to one or more parameters associated with the battery 110. The data 112 may include a specification of energy consumed for each type of operation that may be conducted as well as a running count of each type of operation that has been performed. The data 112 may include an indication of energy remaining in the battery 110. This indication may be provided to one or more system hosts or computers 114.

In some embodiments, the system 100 may include a thermometer 116. The thermometer 116 may be configured to measure or infer a temperature associated with one or more components or devices of the system 100. For example, the temperature measured by the thermometer 116 may be representative of the temperature of the battery 110.

The system 100 is illustrative. In some embodiments, one or more of the entities may be optional. In some embodiments, additional entities not shown may be included. In some embodiments, the entities may be arranged or organized in a manner different from what is shown in FIG. 1.

Figure 2:
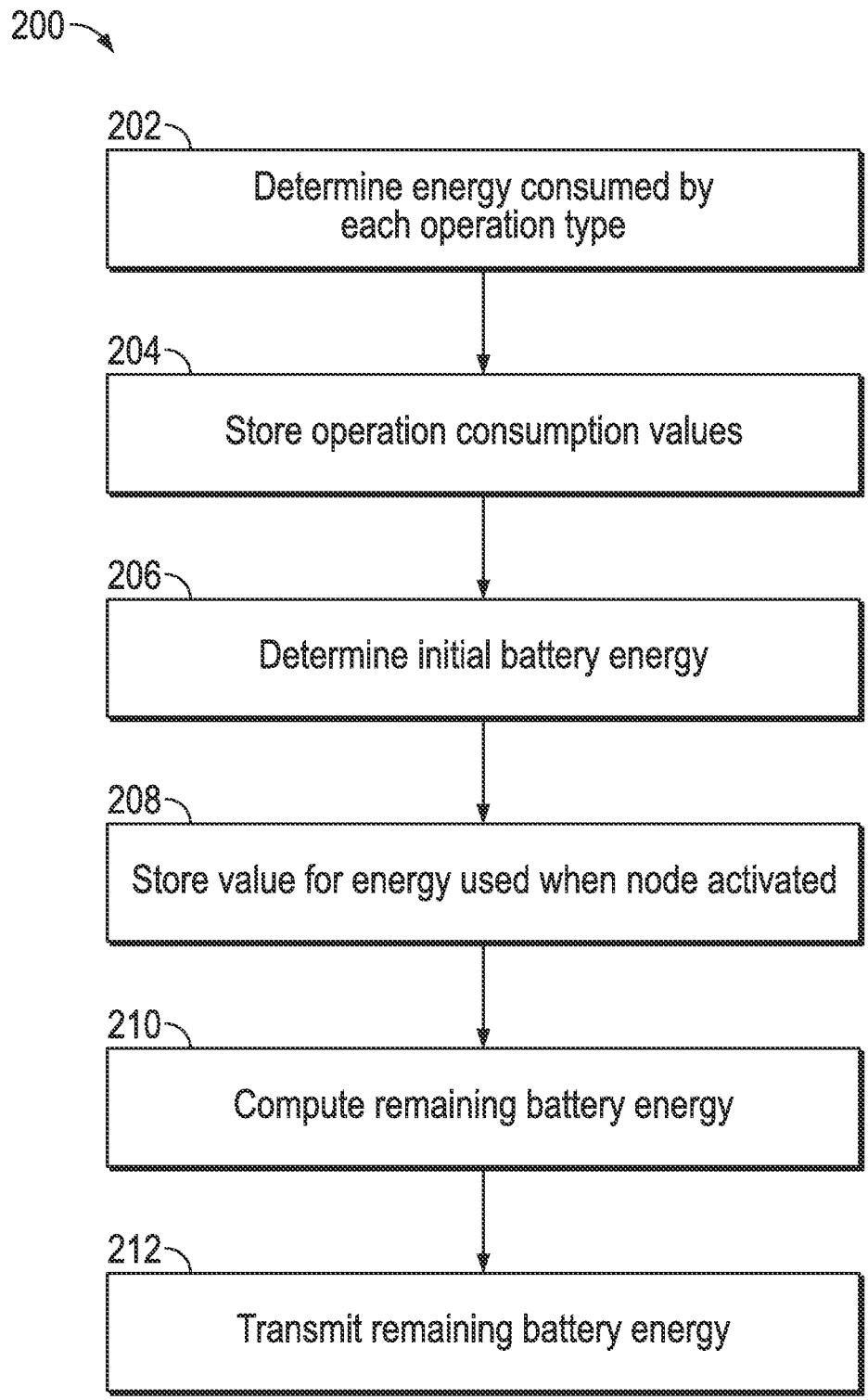
FIG. 2 illustrates a flow chart of an exemplary method.

Turning now to FIG. 2, a flow chart of an exemplary method 200 is shown. The method 200 may be executed by one or more systems, components, or devices, such as those described herein (e.g., the system 100). The method 200 may be used to provide an indication of energy remaining in a battery (e.g., battery 110) powering a device or node.

In block 202, a determination may be made regarding the energy consumed by each type of operation performed by the node. Block 202 may be performed once for a given type of node. For example, if one was manufacturing a large quantity of a given type or model of node, a first of the nodes may be profiled and that profile may be applied to each of the nodes. Alternatively, a profile for each of a plurality of nodes may be averaged and used as a profile to apply to the node. In some embodiments, each of the nodes (e.g., each serial number) may be assigned its own profile to further enhance accuracy.

In some embodiments, the determination of block 202 may be made more than once to account for changes in energy consumption by a node over time. For example, energy consumption may change for the node based on changes in device composition, drift in component values, etc.; performing block 202 at various points in time may account for such changes.

In block 204, the energy consumed by each type of operation performed by the node may be stored. For example, the energy consumed by each type of operation performed may be coded into the node's firmware. If a manufacturing process for a node changes, a wireless transmission of a new profile may be received by the node as an update to an existing profile stored the node.

In block 206, an initial energy associated with the battery may be determined. The initial energy may correspond to a fresh or new battery being deployed or utilized. The value corresponding to the initial energy may be stored at the node.

In block 208, the node may be deployed and activated or turned-on for normal use or operation. Based on the stored consumption values of block 204, the node may store or keep a running sum of energy used as operations are performed by the node. In some embodiments, the energy that is consumed may be a function of temperature, which may be based on measurements provided by a thermometer (e.g., thermometer 116).

In block 210, remaining battery energy may be computed. The remaining battery energy may be computed as the difference between the initial battery energy (block 206) and the energy used during operation (block 208). In some embodiments, the remaining battery energy may be computed as a function of the age of the battery and the battery's self-discharge rate.

In block 212, the node may transmit the remaining battery energy (block 210) to, e.g., a system host or computer (e.g., host/computer 114). The system host/computer may perform a monitoring of remaining battery energy for a number of nodes in a system. Each node may transmit the remaining battery energy periodically or in response to a request (e.g., a polling request) from the system host/computer.

The system host/computer may use the estimate of remaining battery life received from a node to determine or estimate the number of operations that the node can perform until the battery will be depleted (or within a threshold of the battery being depleted). Using a typical operation profile (e.g., number of operations of a given type per unit time), the remaining battery life may be expressed in terms of units of time (e.g., hours, days, months, etc.). In this manner, the host/computer may be used to schedule maintenance or battery replacement activities for the nodes.

The method 200 is illustrative. In some embodiments, one or more of the blocks or operations (or a portion thereof) may be optional. In some embodiments, additional blocks or operations not shown may be included. In some embodiments, the blocks or operations may execute in an order or sequence that is different from what is shown in FIG. 2.

In some embodiments, the system host/computer may store the initial battery energy (block 206). The node may transmit the energy used during operation or run-time (block 208) to the system host/computer, and the system host/computer may determine the remaining battery energy left by subtracting the energy used during operation/run-time from the initial battery energy. In this respect, the node may provide or transmit an indication of the amount of energy drawn from the battery as: (1) an estimation or determination of an amount of battery energy remaining at the node (blocks 210 and 212), or (2) the energy that has been used by the node during operation/run-time (block 208).

Embodiments of the disclosure may provide an ability to estimate battery energy and battery utilization while consuming very little energy. Embodiments may leverage hardware resident in a node to provide for such an estimate, thereby minimizing cost, size, and complexity of a node.

Embodiments of the disclosure may be used in connection with one or more models or algorithms to predict a lifetime associated with one or more batteries. For example, remaining battery energy may be estimated based on initial battery energy and the number and type of operations performed by a node powered by a battery. In this manner, costly maintenance or battery replacement activities may be minimized.

Embodiments of the disclosure may be used to schedule health or maintenance activities in connection with a battery of an aircraft. Aspects of this disclosure may be applied in connection with other environments or application contexts. For example, aspects of the disclosure may be used in mining applications, such as in connection with the use of drag lines or boom stress and strain measurements.

As described herein, in some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments may be implemented using one or more technologies. In some embodiments, an apparatus or system may include one or more processors, and memory storing instructions that, when executed by the one or more processors, cause the apparatus or system to perform one or more methodological acts as described herein. Various mechanical components known to those of skill in the art may be used in some embodiments.

Embodiments may be implemented as one or more apparatuses, systems, and/or methods. In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein.

Aspects of the disclosure have been described in terms of illustrative embodiments thereof. Numerous other embodiments, modifications and variations within the scope and spirit of the appended claims will occur to persons of ordinary skill in the art from a review of this disclosure. For example, one of ordinary skill in the art will appreciate that the steps described in conjunction with the illustrative figures may be performed in other than the recited order, and that one or more steps illustrated may be optional.

What is claimed is:

1. A method for measuring a lifetime of a battery, comprising:
    storing, by a node, a value for an amount of energy drawn from the battery for each type of operation performed by the node;
    determining, by the node, a running count of operations performed when the node is active;
    receiving at the node a request for a remaining battery energy;
    determining, by the node, an amount of energy drawn from the battery based on the amount of energy drawn from the battery for each type of operation and the running count of operations;
    determining, by the node, an indication of the amount of energy drawn from the battery in order to compute a predicted remaining battery energy;
    transmitting the predicted remaining battery energy from the node to a host computer;
    determining at the host computer a remaining number of operations from the remaining battery energy;
    determining a remaining battery time from the remaining number of operations and an operation profile of the node; and
    replacing the battery at a time indicated by the predicted remaining battery time.

2. The method of claim 1, wherein the value for the amount of energy drawn for each type of operation is based on an average profile for a plurality of nodes.

3. The method of claim 1, wherein the value for the amount of energy drawn for each type of operation is based on a profile for the node.

4. The method of claim 1, further comprising:
    receiving, by the node, an update to the value for the amount of energy drawn for at least one of the operations performed by the node;
    storing, by the node, the update to the value; and
    transmitting, by the node, a second indication of a second amount of energy drawn from the battery based on the update to the value.

5. The method of claim 1, further comprising:
    storing an indication of an initial energy associated with the battery.

6. The method of claim 5, wherein the indication of the initial energy is stored by the node.

7. The method of claim 6, further comprising:
    computing, by the node, the predicted remaining battery energy by subtracting the value for the amount of energy drawn from the battery from the initial energy, and
    transmitting the predicted remaining battery energy.

8. The method of claim 1, further comprising transmitting the stored value for the amount of energy drawn from the battery.

9. The method of claim 1, further comprising:
    scheduling at least one of a maintenance activity and a battery replacement activity based on the transmitted indication of the amount of energy drawn from the battery.

10. The method of claim 1, wherein the node is included in one of an aircraft and mining equipment.

11. An apparatus for measuring a lifetime of a battery comprising:
    at least one processor; and
    memory having instructions stored thereon that, when executed by the at least one processor, cause the apparatus to:
        store a value for an amount of energy drawn from a battery powering the apparatus for each type of operation performed by the apparatus;
        determine a running count of operations performed when a node is active;
        receive at the node a request for a remaining battery energy;
        determine an amount of energy drawn from the battery based on the amount of energy drawn from the battery for each type of operation and the running count of operations;
        determine an indication of the amount of energy drawn from the battery in order to compute a predicted remaining battery energy;
        transmit the predicted remaining battery energy from the node to a host computer;
        determine at the host computer a remaining number of operations from the remaining battery energy;
        determine a remaining battery time from the remaining number of operations and an operation profile of the node; and
        replace the battery at a time indicated by the predicted remaining battery time.

12. The apparatus of claim 11, wherein the value for the amount of energy drawn for each type of operation is based on an average profile for a plurality of apparatuses that are of the same model type as the apparatus.

13. The apparatus of claim 11, wherein the apparatus is configured to store an indication of an initial energy associated with the battery.

14. The apparatus of claim 13, wherein the instructions, when executed by the at least one processor, cause the apparatus to:
    measure a temperature associated with the apparatus; and
    compute the predicted remaining battery energy by subtracting the value for the amount of energy drawn from the battery as a function of the measured temperature from the initial energy.

15. The apparatus of claim 11, further comprising transmitting an indication of the amount of energy drawn from the battery.

16. An aircraft comprising:
    a wireless node configured to:
        store a value for an amount of energy drawn from a battery powering the node for each type of operation performed by the node;
        determine a running count of operations performed when the node is active;
        receive a request for a remaining battery energy;
        determine an amount of energy drawn from the battery based on the amount of energy drawn from the battery for each type of operation and the running count of operations;
        determine an indication of the amount of energy drawn from the battery in order to compute a predicted remaining battery energy;
        transmit the predicted remaining battery energy; and
    a host computer configured to:

receive the predicted remaining battery energy from the node;

determine at the host computer a remaining number of operations from the remaining battery energy;

determine a remaining battery time from the remaining number of operations and an operation profile of the node; and replace the battery at a time indicated by the predicted remaining battery time.

17. The aircraft of claim 16, wherein the value for the amount of energy drawn for each type of operation is based on an average profile for a plurality of nodes that are of the same model type as the node.

18. The aircraft of claim 16, wherein the node is configured to store an indication of an initial energy associated with the battery.

19. The aircraft of claim 18, wherein the node is configured to:

compute the predicted remaining battery energy based on: the value for the amount of energy drawn from the battery, the initial energy, an age of the battery, and a self-discharge rate associated with the battery, wherein the transmitted indication of the amount of energy drawn from the battery comprises the predicted remaining battery energy.

20. The aircraft of claim 16, further comprising transmitting an indication of the amount of energy drawn from the battery.

21. An apparatus, comprising:

at least one processor; and memory having instructions stored thereon that, when executed by the at least one processor, cause the apparatus to:

store first values corresponding to energy consumed by a wireless node for a plurality of operation types;

store a second value corresponding to an initial battery energy associated with a battery that powers the wireless node;

receive a request for a remaining battery energy;

determine an amount of energy drawn from the battery based on a running count of the plurality of operation types and the first values;

predict a remaining battery energy associated with the battery based on a difference between the second value and the determined amount of energy drawn from the battery;

transmit the predicted remaining battery energy; and a host computer configured to:

receive the predicted remaining battery energy from the node, determine at the host computer a remaining number of operations from the remaining battery energy, determine a remaining battery time from the remaining number of operations and an operation profile of the node, and replace the battery at a time indicated by the predicted remaining battery time.

22. The apparatus of claim 21, wherein the predicted remaining battery energy is based on a profile of the wireless node that specifies a number of operations of a given type executed by the wireless node per unit time.

* * * * *